United States Patent
Svenson (10) Patent No.: US 6,859,479 B2
(45) Date of Patent: Feb. 22, 2005

(54) LASER MODULATOR

(75) Inventor: Lars-Göte Svenson, Sollentuna (SE)

(73) Assignee: Optillion Operations AB, Stockholm (SE)

( * ) Notice: Subject to any disclaimer, the term of this patent is extended or adjusted under 35 U.S.C. 154(b) by 0 days.

(21) Appl. No.: 10/492,651

(22) PCT Filed: Nov. 22, 2002

(86) PCT No.: PCT/SE02/02142

§ 371 (c)(1),
(2), (4) Date: Apr. 14, 2004

(87) PCT Pub. No.: WO03/047055

PCT Pub. Date: Jun. 5, 2003

(65) Prior Publication Data

US 2004/0264535 A1 Dec. 30, 2004

(30) Foreign Application Priority Data

Nov. 30, 2001 (SE) .............................................. 0104033

(51) Int. Cl.[7] .............................................. H01S 5/00
(52) U.S. Cl. ...................................................... 372/50
(58) Field of Search ........................... 372/9, 26, 43–50

(56) References Cited

U.S. PATENT DOCUMENTS

| | | | |
|---|---|---|---|
| 4,503,541 A | * | 3/1985 | Weller et al. .................. 372/50 |
| 5,383,216 A | * | 1/1995 | Takemi .......................... 372/50 |
| 5,798,856 A | * | 8/1998 | Suzuki et al. ................. 398/183 |
| 6,191,464 B1 | * | 2/2001 | Barnard ........................ 257/427 |
| 6,574,260 B2 | * | 6/2003 | Salvatore et al. ............... 372/50 |

FOREIGN PATENT DOCUMENTS

| | | |
|---|---|---|
| EP | 0 749 154 A2 | 12/1996 |
| EP | 0 809 129 A2 | 11/1997 |
| EP | 0 917 260 A1 | 5/1999 |
| EP | 1 073 168 A1 | 1/2001 |

OTHER PUBLICATIONS

Copy of International Search Report for PCT/SE02/02142, dated Feb. 27, 2003.

* cited by examiner

Primary Examiner—Quyen Leung
(74) Attorney, Agent, or Firm—Alston & Bird LLP (57) ABSTRACT

An integrated device is provided having both laser and modulator sections. The laser section generates a primary light signal using a distributed feedback process. The modulator section influences the primary light signal by means of an electroabsorption process. The laser and modulator sections are electrically separated from each other with respect to anode and cathode areas. As a result, a single supply voltage can be used to operate the device. An optical transmitter contains, in addition to the integrated device, a protocol converter which receives an information signal to be transmitted and generates a control signal which is received by a modulator driver. Based thereon, the modulator driver produces a modulating signal, which causes a modulated light signal representing the information signal to be output. A laser bias control unit controls the output power level of the primary light signal based on a leak signal from the laser section.

21 Claims, 6 Drawing Sheets

LASER MODULATOR

FIELD OF THE INVENTION

The present invention relates generally to the production of modulated light signals for transmission of information. More particularly the invention relates to an integrated device for emitting a modulated light signal according to the preamble of claim 1 and an optical transmitter according to the preamble of claim 10.

THE BACKGROUND OF THE INVENTION AND PRIOR ART

Optical communication systems transport information in the form of modulated fight signals. A semiconductor laser is normally used to accomplish these signals (laser=light amplification by stimulated emission of radiation). A direct modulated laser, however, inevitably shifts the wavelength of the primary flight signal to some degree when the signal is modulated. This causes dispersion, i.e. degradation of the signal due to the fact that the various wave components experience different propagation velocities. The severity of the dispersion problem increases with increased bitrate and fiber length. Today, direct modulated lasers of 1300 nm wavelength can be used at 10 Gbit/s for transmission over relatively short optical fibers. Nevertheless, at higher bitrates and/or longer distances a distributed feedback laser with an electroabsorption modulator (DFB-EA) can be used to generate modulated light signals around the wavelength 1550 nm. A DFB-EA modulator represents a combination of a continuous light emitting laser with a narrow spectral width and an electroabsorption modulator. The laser here operates at a constant current, which results in a relatively low chirp (i.e. undesired rapid changing of the frequency/wavelength).

Various efforts have, of course, already been made to improve the performance of the optical transmitters. For instance, the document EP, A2, 0 809 129 describes a semiconductor optical modulator, which includes a separately mounted electroabsorption-type optical modulator for modulating an optical signal. The modulator may accomplish a high-speed transmission of an optical signal with a low insertion loss and a low chirp. However, the design is comparatively bulky and expensive. Moreover, a complex calibration of two sets of optical fibers and lenses is required.

U.S. Pat. No. 6,191,464 discloses a solution which aims at avoiding modulation and chirp of the laser when there is no information signal present at the modulator input. The suggested solution involves electrical separation of semiconductor components integrated within an integrated optoelectronic device. A complete DFB-EA modulator is fabricated on the same substrate. The anode of the laser diode and the anode of the modulator are electrically separated by an isolation region, Nevertheless, the laser cathode and the modulator cathode are connected to a common ground potential.

The documents JP, A, 5 524 751; EP, A1, 0 917 260 and EP, A1, 1 073 168 describe other examples of optical modulators with a quantum well laser and an electroabsorption modulator being integrated on the same substrate. Also here, the laser and the modulator are electrically separated with respect to the anodes. However, the components are electrically connected via a common substrate, which functions as a cathode for both of them.

Figure 1:
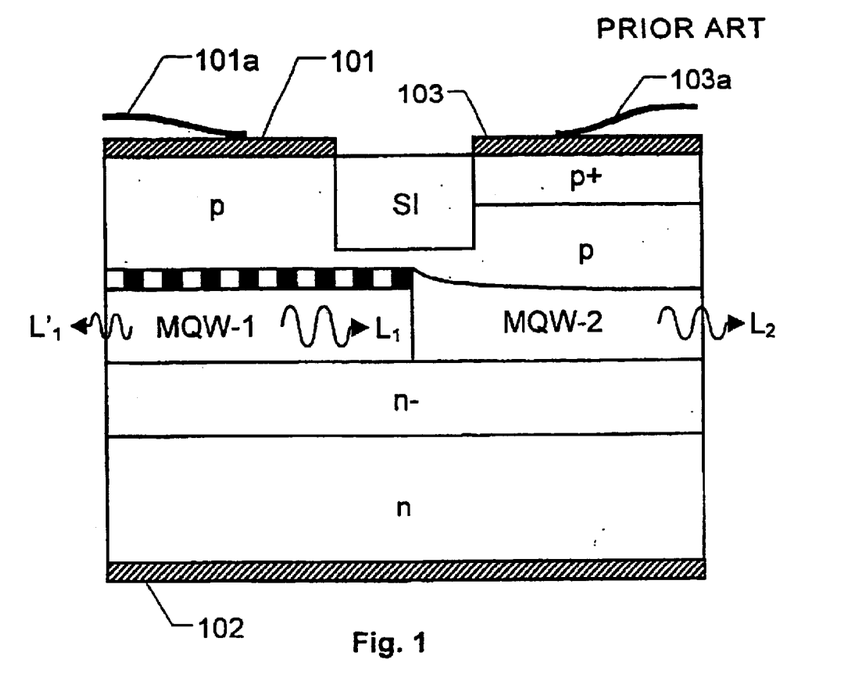
FIG. 1 shows a per se known integrated structure including a laser section and a modulator section.
Figure 2:
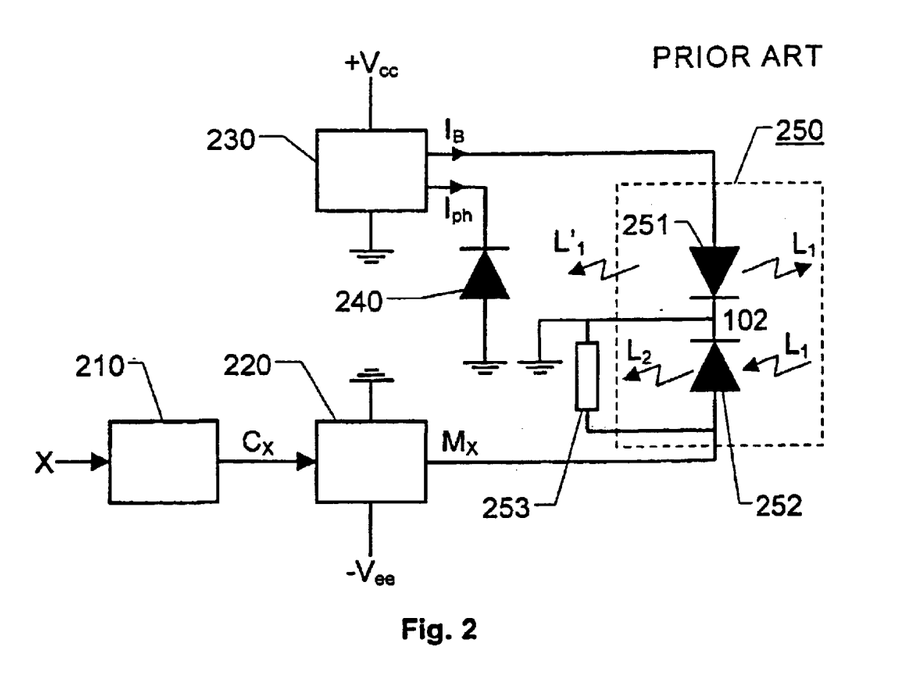
FIG. 2 shows a block diagram over a known optical transmitter which utilizes the structure shown in FIG. 1.

As can be seen from the above examples it is common practice in DFB-EA modulator design to arrange the laser section and the modulator section on a single substrate with a common cathode connection for both the laser and the modulator. FIG. 1 shows a typical laser-modulator structure of this kind and FIG. 2 illustrates an exemplary optical transmitter, which includes such laser-modulator 250.

A protocol converter 210 receives an information signal X and produces in response thereto a control signal $C_X$, which typically has a serial format, whereas the information signal X might have a parallel format. In any case, the control signal $C_X$ has a relatively large bandwidth. A modulator driver 220 receives the control signal $C_X$ and generates in response thereto a modulating signal $M_X$, which is adapted to a modulator section 252 in the laser-modulator 250. A laser bias control unit 230 generates a bias current $I_B$ to a laser section 251 in the laser-modulator 250. The bias current $I_B$ controls the output power level of the primary light signal $L_1$, which is generated in a first quantum well structure MQW-1 in the laser section 251, such that the power of the primary light signal $L_1$ lies within a desired range for the specific application. A control loop determines what is an appropriate value of the bias current $I_B$. The control loop contains a monitor diode 240, which detects a leak signal $L'_1$ of the primary light signal $L_1$ from the laser section 251. Based on the leak signal $L'_1$, the monitor diode 240 delivers a feedback signal $I_{ph}$ to the laser bias control unit 230. The feedback signal $I_{ph}$ (or photocurrent) is proportional to the primary light signal $L_1$. The control unit 230 assigns a suitable bias current $I_B$ depending on the feedback signal $I_{ph}$. The modulating signal $M_X$ influences (or more precisely attenuates) the primary light signal $L_1$ from the laser section 251, when this signal passes through a second quantum well structure MQW-2 in the modulator section 252, in such manner that an outgoing modulated light signal $L_2$ is produced, which represents the information signal X. A resistor 253, of say 50 Ω, may also be connected in parallel with the diode in the modulator 252 in order to terminate signal reflections.

Returning to FIG. 1, the laser section 251 contains a separate anode area of a positive doping polarity p (e.g. InP), accessible via a first anode contact 101 and a first anode lead 101a. Correspondingly, the modulator section 252 contains another separate anode area p+ (e.g. InGaAs), also of positive doping polarity, which is accessible via a second anode contact 103 and a second anode lead 103a. A semi-insulating area SI (e.g. InP) separates the laser anode area p from the modulator anode area p+. A sub-layer p of anode area p+ in the modulator section 252 may extend below the un-doped area SI to contact the laser anode area p. However in any case, both the laser section 251 and the modulator section 252 share a common cathode area of negative polarity, for example in the form of a layer n− (InP) and a substrate n (InP). The cathode area is accessible via a cathode contact 102, which normally is connected to the ground potential. As a result thereof, the laser section 251 will have to be biased by a positive voltage $+Y_{cc}$ on its anode 101, whereas the modulator section 252 must be biased by a negative voltage $-V_{ee}$ on its anode 103.

Consequently, a DFB-EA modulator according to this design requires both a positive supply voltage $+V_{cc}$, and a negative supply voltage $-V_{ee}$. This in turn, gives rise to a comparatively large, complex and expensive circuitry. Moreover, the modulator demands a high voltage swing from the modulator driver in; order to obtain a sufficiently high extinction ratio (i.e. the ratio of the two optical power levels used to represent information on a binary format). Typically, the required voltage swing is higher than what can be accomplished by means of a high-speed CMOS process (CMOS=complementary metal-oxide semiconductor), which of course, places severe restrictions and demands on the modulator driver.

SUMMARY OF THE INVENTION

The object of the present invention is therefore to provide a solution for the production of information carrying (i.e. modulated) light signals, which alleviates the problems above and thus offers a power and size efficient design of moderate circuit complexity.

According to one aspect of the invention the object is achieved by an integrated device for emitting a modulated light signal as initially described, which is characterized in that the laser section and the modulator section are electrically separated from each other, such that a laser anode area is electrically isolated from a corresponding modulator anode area. A laser cathode area is also electrically isolated from a corresponding modulator cathode area.

This separation of the laser and the modulator sections is very advantageous, since it is thereby possible to operate the device with a single supply voltage, even though the laser requires a positive bias voltage and the modulator requires a negative bias voltage.

According to a preferred embodiment of this aspect of the invention, the laser section comprises at least one externally accessible laser anode contact plus at least one externally accessible laser cathode contact. Correspondingly, the modulator section comprises at least one externally accessible modulator anode contact as well as at least one externally accessible modulator cathode contact. The advantage with the thus accessible contacts is that they facilitate the connection of relevant groundings and supply voltages.

According to another preferred embodiment of this aspect of the invention, the integrated device comprises a semi-insulating region between the laser anode area and the modulator anode area, which in an uncomplicated manner electrically separates these areas from each other.

According to yet another preferred embodiment of this aspect of the invention, the integrated device comprises a proton bombarded region between the first quantum well structure, and the second quantum well structure. The proton bombarded region extends through a first doped layer having a first doping polarity below the quantum well structures. Moreover, a modulator cathode contact is connected to the first doped layer.

Hence, the proton bombarded region accomplishes two regions in the first doped layer, which are electrically isolated from each other. An advantage of this is that the proton bombarded region per se may accomplish the electrical separation between the laser and modulator cathode areas.

According to a first preferred alternative embodiment of: this aspect of the invention, the integrated device comprises two mutually reverse biased diodes, which separate the laser cathode area electrically from the modulator cathode area. The diodes may be represented by a separation layer below the first doped layer, which has an opposite doping polarity to the first doping polarity, i.e. that of the first doped layer below the quantum well structures. Preferably, a diode bias area between the anodes of the diodes is also externally accessible via a bias contact.

This first preferred alternative embodiment is advantageous in many ways, since it allows a straight-forward attachment of a laser cathode directly to the substrate of the device.

According to a second preferred alternative embodiment of this aspect of the invention, the integrated device instead comprises a semi-insulating layer below the first doped layer. This layer, in combination with the proton bombarded region, thereby separates the laser cathode area electrically from the modulator cathode area.

This second preferred alternative embodiment is very advantageous, since it on one hand results in a comparatively compact device structure, and on the other hand does not require a diode bias supply.

According to another aspect of the invention the object is achieved by an optical transmitter as initially described, which is characterized in that the laser unit comprises the above proposed integrated device. Hence, the transmitter only needs a single supply voltage, which of course is advantageous due to the reasons stated initially.

According to a preferred embodiment of this aspect of the invention, the optical transmitter comprises a protocol converter, which receives at least one signal that represents the information to be transmitted, and in response thereto generates the control signal. An advantage with the protocol converter is that it may transform the actual information signal into a signal format which is adapted to the modulator driver and the laser unit in the transmitter.

According to a preferred embodiment of this aspect of the invention, the optical transmitter comprises a monitor diode that detects a leak signal of the primary light signal. Based on the detected signal, the monitor diode delivers a feedback signal to the laser bias control unit, which in turn forms a basis for the a bias current fed to the laser unit. An advantageous effect of this control loop is that the average output power from the laser can thereby be maintained at a desired level.

According to another preferred embodiment of this aspect of the invention, the modulating signal comprises a varying modulator voltage component, which represents the information to be transmitted by the optical transmitter. The modulating signal also comprises a substantially fixed modulator bias voltage component, which is adapted to a value being optimal with respect to the application in question. A lowered bias voltage (i.e. a more negative value) results in a decreased optical output power level, which generally is undesired. At the same time, the lowered bias voltage decreases the modulator's chirp, which is a desired effect. In any case, the proposed signal format is advantageous, since it makes it possible to generate an modulator signal which is optimal with respect to the modulator's characteristics.

According to a first preferred alternative embodiment of this aspect of the invention, the modulator driver comprises a terminated output, which delivers the modulating signal to the laser unit according to a single-ended format. A single-ended signal format is desirable in many applications, particularly where a relatively low frequency output is demanded.

According to a second preferred alternative embodiment of this aspect of the invention, the modulator driver comprises a terminated output, which is differentially coupled to the laser unit. This output thus delivers the control signal to the laser unit according to a differential format. Preferably, the modulator driver also comprises a separate bias input for receiving a reference voltage level, which provides a drive voltage to the modulator section in the laser unit.

A differential format signal format is often desirable, since the swing of the modulator signal can thereby be equal to the entire potential difference between the supply voltage and the ground voltage. This, in turn, means that a power efficient low-voltage driver can be used to provide the supply voltage. Furthermore, a differential signal is less sensitive to disturbances and the signal itself generally causes less disturbances to other signals. This is due to the fact that the total average current is substantially constant.

According to yet another preferred embodiment of this aspect of the invention, the optical transmitter comprises a duty cycle control unit, which compensates for the exponential transfer function of the modulator section in the laser unit. The advantage of such non-linear compensation is, of course, that the control and tuning of the modulator driver can be made much simpler than otherwise.

According to an additional preferred embodiment of this aspect of the invention, the modulator driver comprises at least one terminated output, which delivers a respective low-frequency modulating signal to the laser unit. The modulating signal from at least one terminated output thus predominantly contains spectral components that represent relatively low frequencies. The differential outputs, on the other hand, deliver wide-frequency modulating signals, which contain spectral components that represent both relatively high frequencies and relatively low frequencies. The at least one low-frequency modulating signal is preferably produced by a respective low pass filtering chain, which receives a respective primary modulating signal.

The advantage obtained by this spectral separation of the modulating signals is that the high-frequency signals can use a well terminated driver with small capacitors, while the terminated outputs need only be used for delivering the low-frequency signals.

The invention offers a highly efficient and flexible solution for generating modulated light signals. Simultaneously, the invention vouches for power efficient designs of comparatively small sizes and moderate circuit complexity. Naturally, the invention will therefore provide a competitive edge to any communication system where optical transmitters are utilized for the transmission of information.

BRIEF DESCRIPTION OF THE DRAWINGS

The present invention is now to be explained more closely by means of preferred embodiments, which are disclosed as examples, and with reference to the attached drawings.

DESCRIPTION OF PREFERRED EMBODIMENTS OF THE INVENTION

Figure 3A:
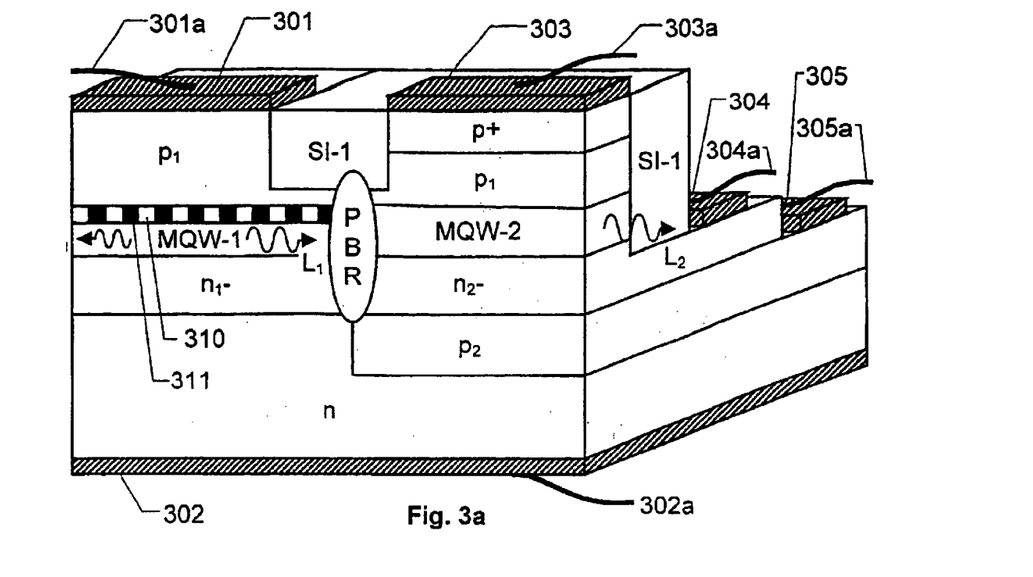
FIG. 3a shows an integrated laser-modulator structure according to a first alternative of a first embodiment of the invention.

FIG. 3a shows an integrated laser-modulator structure according to a first alternative of a first embodiment of the invention. A laser section here contains a separate anode area of a positive doping polarity $p_1$ (e.g. InP), which is accessible via a first anode contact 301 and a first anode lead 301a. Correspondingly, the modulator section contains another separate anode area p+ (e.g. InGaAs), also of positive doping polarity, which is accessible via a second anode contact 303 and a second anode lead 303a. A semi-insulating region (i.e. un-doped area) SI-1 (e.g. InP) separates the laser anode area $p_1$ from the modulator anode area p+. A sub-layer $p_1$ of the anode area p+ in the modulator section 252, extends below the first un-doped area SI-1 and contacts the laser anode area pi.

The laser section has a two-layered cathode area containing a first layer $n_1-$ (e.g. InP) of negative doping polarity and a substrate n (e.g. InP), also of negative doping polarity. The modulator section has a corresponding cathode area in the form of a second layer $n_2-$ (e.g. InP) of negative doping polarity, which is, however, electrically isolated from the first layer $n_1-$ by means of two mutually reverse biased diodes. The diodes are represented by a separation layer $P_2$ (e.g. InGaAs) of a positive doping polarity below the second layer $n_2-$. The laser cathode area $n_1-$; n is externally accessible via a first cathode contact 302 and a first cathode lead 302a, while the modulator cathode area $n_2-$ is externally accessible via a second cathode contact 304 and a second cathode lead 304a. A bias contact 305 and a bias lead 305a make the separation layer $P_2$ (i.e. an electrical point between the respective cathode areas $n_1-$; n and $n_2-$) externally accessible, such that a voltage can be applied between the anodes of the two mutually reverse biased diodes. Typically, this point is allocated the ground potential, however technically, any other voltage may be applied.

The integrated laser-modulator structure according to the first embodiment of the invention also contains a first quantum, well structure MQW-1 below the laser anode area $p_1$ for generation of a primary light signal $L_1$, and a second quantum well structure MQW-2 below the modulator anode area p+; $p_1$, for influencing the primary light signal $L_1$ by means of electroabsorption: (i.e. variably attenuating the primary light signal $L_1$). The modulator thus modulates the primary light signal $L_1$ and produces a resulting modulated light signal $L_2$ depending on the voltage across the second anode contact 303 and the second cathode contact 304, such that a relatively high voltage there over results in a modulated light signal $L_2$ of comparatively low power and a relatively low voltage there over results in a modulated light signal $L_2$ of comparatively high power.

The first quantum well structure MQW-1 includes a layer, which includes different impurities 310 of e.g. InP and 311 of: e.g. InGaAsP that are distributed over the structure MQW-1 in an alternating manner. The different materials in the impurities 310 and 311 have different refractive indices and thus represent a grating, which determines the wavelength of the light signal $L_1$ being produced by the laser. Preferably, both the impurities 310 and 311 have a positive doping polarity.

A proton bombarded region PBR is included between the first quantum well structure MQW-1 and the second quantum well structure MQW-2. The proton bombarded region PBR extends through the respective negative doped layers $n_1-$ and $n_2-$ below the quantum well structures MQW-1 and MQW-2, such that also the negative doped layers $n_1-$ and $n_2-$ are electrically separated from each other. Thus, a first negative doped layer $n_1-$ is located below the first quantum well structures MQW-1 and a second negative doped layer $n_2-$ is located below the second quantum well structures MQW-2. The proton bombarded region PBR guarantees a complete electrical separation between the laser and modulator cathode areas $n_1-$; n and $n_2-$ respectively.

Figure 3B:
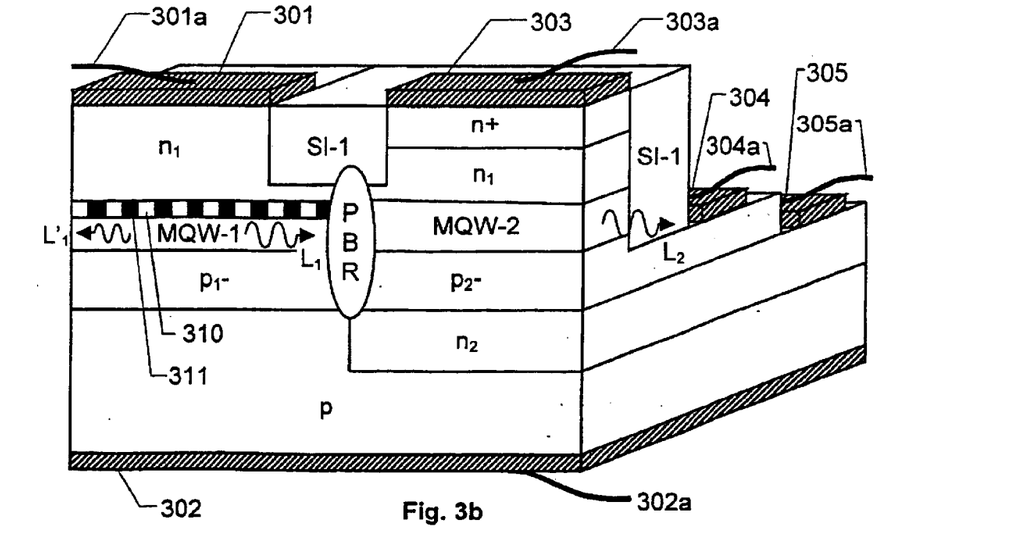
FIG. 3b shows an integrated laser-modulator structure according to a second alternative of the first embodiment of the invention.

FIG. 3b shows an integrated laser-modulator structure according to a second alternative of the first embodiment of the invention. This design is essentially the same as that illustrated in FIG. 3a. However, the modulator is here built on a positively doped substrate p instead of a negative n. As a consequence thereof, all other layers $n_2$, $P_1-$, $P_2-$, $n_1$; n+ and contacts 301–305 have the opposite polarity relative the embodiment shown in FIG. 3a. Moreover, the modulator has a common anode (as opposed to common cathode) and the drive voltage to the laser must be negative (instead of positive).

Figure 3C:
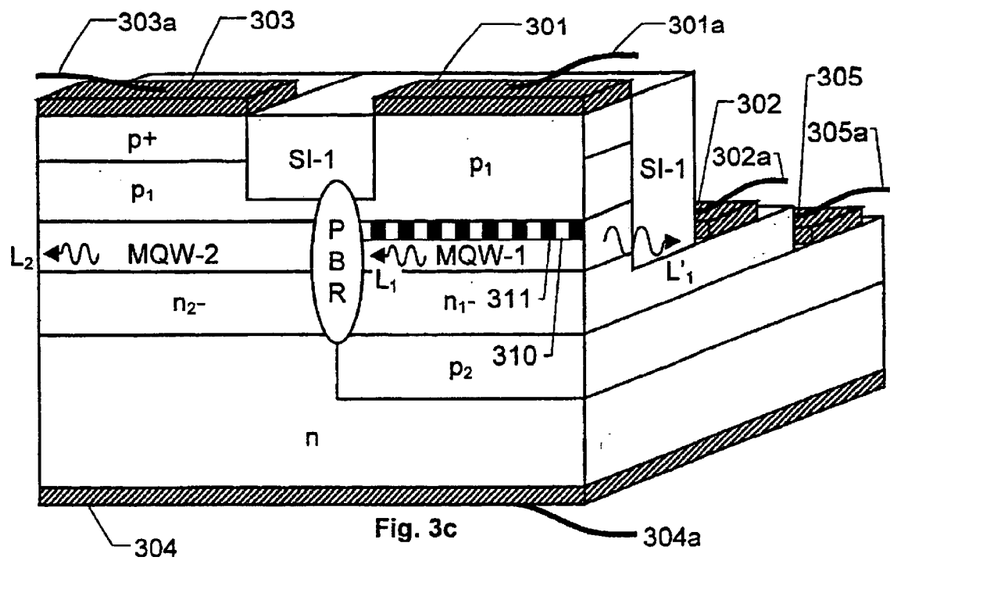
FIG. 3c shows an integrated laser-modulator structure according to a third alternative of a first embodiment of the invention.

FIG. 3c shows an integrated laser-modulator structure according to a third alternative of a first embodiment of the invention. This design is, with respect to doping polarities, equivalent to the design described with reference FIG. 3a above. However, here the modulator section is connected to the base contact 304 while the laser section is electrically isolated from the substrate n. All reference numerals signify the same elements as described in relation to FIG. 3a.

Figure 3D:
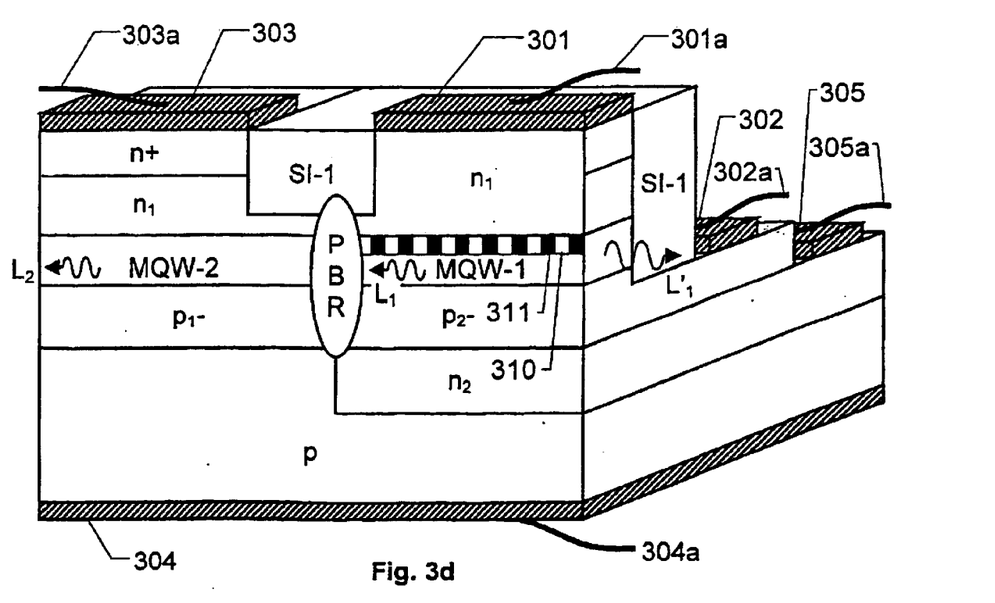
FIG. 3d shows an integrated laser-modulator structure according to a fourth alternative of the first embodiment of the invention.

Correspondingly, FIG. 3d shows an integrated laser-modulator structure according to a fourth alternative of the first embodiment of the invention, which is equivalent to the design described with reference FIG. 3b above.

Figure 4:
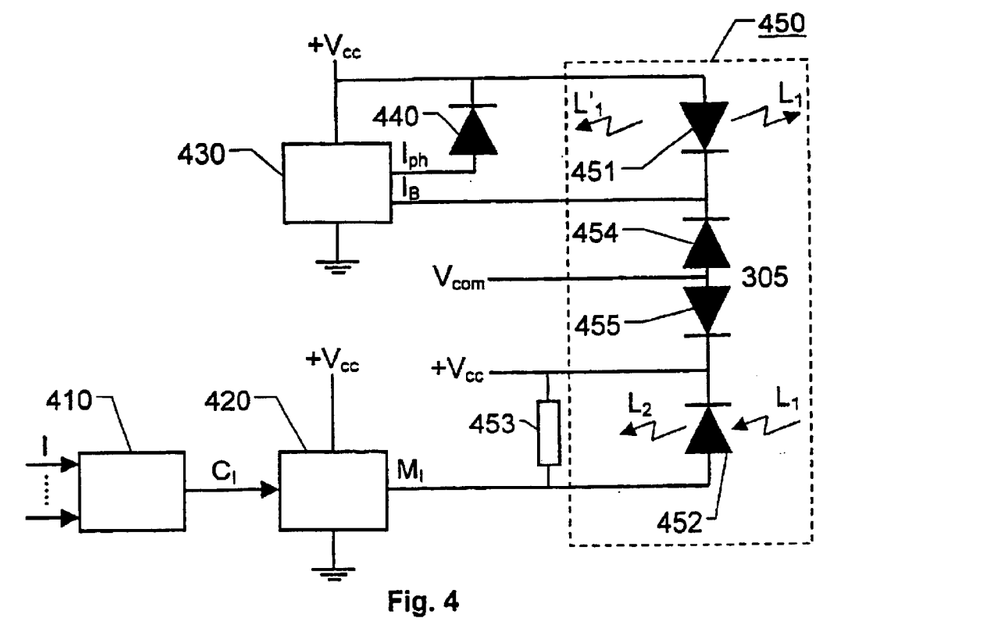
FIG. 4 shows a block diagram over a proposed optical transmitter including a single-ended modulator driver.

FIG. 4 shows a first block diagram over a proposed optical transmitter, which includes a laser unit 450 according to the invention. The laser unit 450 is here fed by a single-ended modulator driver 420. A protocol converter 410 receives at least one signal I, which represents information to be transmitted via a modulated optical signal $L_2$. The protocol converter 410 may receive the at least one signal I on a parallel format and perform various operations with respect to the at least one signal I, such as coding and scrambling, before a corresponding control signal $C_I$ is delivered on the protocol converter's 410 output.

A modulator driver 420 receives this control signal C, and generates in response thereto a modulating signal MI, which is adapted to a modulator section 452 in the laser unit 450. The modulating signal $M_I$ format preferably comprises a varying modulator voltage component, which represents the information I, and a substantially fixed modulator bias voltage component, which is adapted to an optimal value with respect to the particular application. As mentioned earlier, on one hand, a lowered bias voltage (i.e. a more negative value) results in a decreased optical output power level, and on the other hand, the lowered bias voltage additionally decreases the modulator's chirp. According to a preferred embodiment of the invention, the modulator driver 420 is also adapted to compensate for the exponential transfer function of the modulator section 452, such that the control and tuning of the modulator driver 420 becomes relatively simple and straight-forward.

A laser bias control unit 430 generates a bias current $I_B$ to a laser section 451 in the laser unit 450. The bias current $I_B$ controls the output power level of the primary light signal $L_1$, which is generated in a first quantum well structure MQW-1 in the laser section 451, such that the power of the primary light signal $L_1$ lies within a desired range for the specific application. A control loop determines what is an appropriate value of the bias current $I_B$.

The control loop contains a monitor diode 440, which detects a leak signal $L'_1$ of the primary light signal $L_1$ from the laser section 451, for example coming out a rear facet of the laser unit 450. Based on the leak signal $L'_1$, the monitor diode 440 delivers a feedback signal $I_{ph}$, which is proportional to the primary light signal $L_1$ to the laser bias control unit 430. The laser bias control unit 430 assigns a suitable bias current is depending on the feedback signal $I_{ph}$. The modulating signal $M_I$ influences (attenuates) the primary light signal $L_1$ from the laser section 451 by means of an electroabsorption process, when this signal $L_1$ passes through a second quantum well structure MQW-2 in the modulator section 452, in such manner that an outgoing modulated light signal $L_2$ is produced, which represents the information signal I.

Analogous with the known optical transmitter shown in FIG. 2, a resistor 453 is preferably connected in parallel with the modulator section 452 in order to terminate any undesired signal reflections. As mentioned with reference to FIG. 3a above, the laser unit 450 may contain two mutually reverse biased diodes 454 and 455 respectively. Hence, a voltage $V_{com}$ (e.g. ground voltage) may be applied via a bias contact 305 between the anodes of these diodes 454 and 455. Both the laser section 451 and the modulator section 452 can thereby be fed by one and the same supply voltage $+V_{cc}$. This allows the single-ended modulator driver 420 to deliver a modulating signal $M_I$ with a maximum swing of $|+V_{cc}|/2$.

The supply voltage $+V_{cc}$ may, of course, be used as supply to the modulator driver 420 and the laser bias control unit 430. Provided that the design allows, the supply voltage $+V_{cc}$ could additionally drive the protocol converter 410 (however not illustrated in the figure).

Figure 5A:
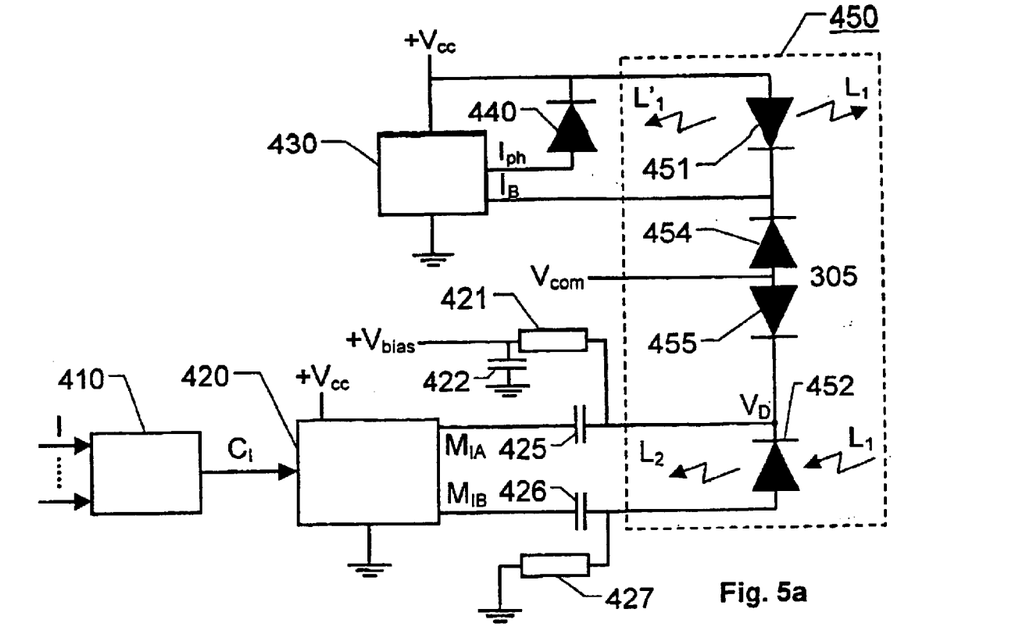
FIG. 5a shows a block diagram over an optical transmitter according to a first embodiment of the invention, which includes a differential modulator driver.

FIG. 5a shows a block diagram over an optical transmitter, which includes a laser unit 450 according to a first embodiment of the invention. The laser unit 450 is here fed by a differential modulator driver 420. A protocol converter 410 receives at least one signal I, which represents information to be transmitted via a modulated optical signal $L_2$. The protocol converter 410 may receive the at least one signal I on a parallel format and perform various operations with respect to the at least one signal I, such as coding and scrambling, before a corresponding control signal $C_I$ is delivered on the protocol converter's 410 output.

The differential modulator driver 420 receives the control signal $C_I$ and generates in response thereto differential modulating signals $M_{IA}$ and $M_{IB}$ which are adapted to a modulator section 452 in the laser unit 450. According to a preferred embodiment of the invention and in similarity with the embodiment of the invention described with reference to FIG. 4 above, the modulator driver 420 is also adapted to compensate for the exponential transfer function of the modulator section 452.

A laser bias control unit 430 generates a bias current $I_B$ to a laser section 451 in the laser unit 450. The bias current $I_B$ controls the output power level of the primary light signal $L_1$, which is generated in a first quantum well structure MQW-1 in the laser section 451, such that the power of the primary light signal $L_1$ lies within a desired range for the specific application. A control loop determines what is an appropriate value of the bias current $I_B$.

The control loop contains a monitor diode 440, which detects a leak signal $L'_1$, of the primary light signal $L_1$ from the laser section 451, for example coming out a rear facet of the laser unit 450. Based on the leak signal $L'_1$, the monitor diode 440 delivers a feedback signal $I_{ph}$, which is proportional to the primary light signal $L_1$ to the laser bias control unit 430. The laser bias control unit 430 assigns a suitable bias current $I_B$ depending on the feedback signal $I_{ph}$. The modulating signal $M_I$ influences (attenuates) the primary light signal $L_1$ from the laser section 451 by means of an electroabsorption process, when this signal $L_1$ passes through a second quantum well structure MQW-2 in the modulator section 452, in such manner that an outgoing modulated light signal $L_2$ is produced, which represents the information signal I.

As mentioned with reference to FIGS. 3 and 4 above, the laser unit 450 may contain two mutually reverse biased diodes 454 and 455 respectively. Hence, a voltage $V_{com}$. (e.g. ground voltage) may be applied via a bias contact 305 between the anodes of these diodes 454 and 455. The laser section 451 can thereby be fed directly by a supply voltage $+V_{cc}$.

The same supply voltage $+V_{cc}$ can also be used for the modulator section 452, however only as a derived bias voltage $+V_{bias}$ for assigning a suitable voltage to a point $V_D$ on the modulator section's 452 cathode, since the modulator driver is differentially connected to the modulator section 452 via a first coupling capacitor 425 and a second coupling capacitor 426.

The modulator section 452 receives a first differential modulating signal $M_{IA}$ via the first coupling capacitor 425 and a second differential modulating signal $M_{IB}$ via the second coupling capacitor 426. A first resistor 421 and a first capacitor 422 terminates the first differential modulating signal MIA. The bias voltage $+V_{bias}$ is applied to a point between the first resistor 421 and the first capacitor 422. A second resistor 427 terminates the second differential modulating signal $M_{IB}$ directly to ground. For example, if the bias voltage $+V_{bias}$ equals 2V and the differential modulating signals $M_{IA}$ and $M_{IB}$ each has a swing of ±0,5V in a push-pull relationship, the voltage in the point $V_D$ will vary between +1V (when $M_{IA}$ attains its lowest value and $M_{IB}$ its highest) and +3V (when $M_{IA}$ attains its highest value and $M_{IB}$ its lowest).

The above-described differential feeding of the modulator section 452 being accomplished by the modulator driver 420 allows the modulating signal, i.e. the difference between $M_{IA}$ land $M_{IB}$, to have a maximum swing of $|+V_{cc}|$, which of course is more power efficient than the single-ended driving.

Figure 5B:
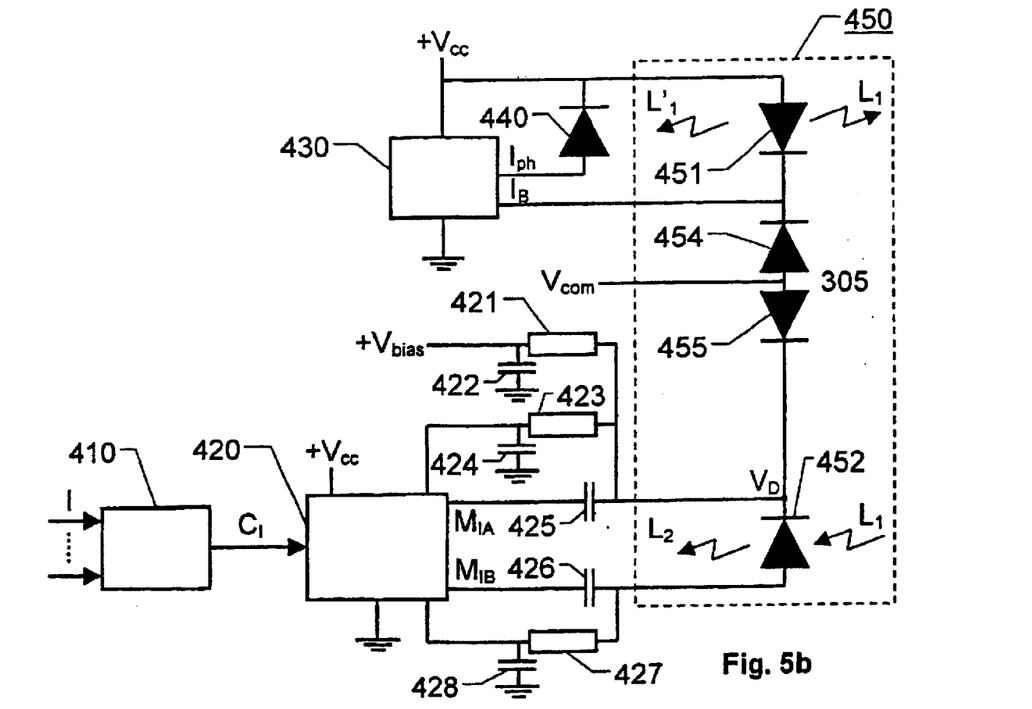
FIG. 5b shows a block diagram over an optical transmitter according to a second embodiment of the invention, which includes a differential modulator driver.

FIG. 5b shows a block diagram over a proposed optical transmitter, which includes a laser unit 450 according to a second embodiment of the invention. This embodiment is especially adapted for producing a relatively low-frequency outgoing modulated light signal $L_2$ (i.e. with a comparatively low lower cut-off frequency). All units and components bearing the same identifiers as used in FIG. 5a here have the same functions as described above with reference to this figure. However, a second resistor 423 and a second capacitor 424 are added in order to provide a sufficient termination of the higher frequencies. For the same reason, a third capacitor 428 has been added between the second resistor 427 and the ground potential. Furthermore, both the second capacitor 424 and the third capacitor 428 are connected to the modulator driver 420. The extra capacitors 424 and 428 are necessary because there is a physical limit as to the highest possible value for the first capacitor 422 (and as a consequence thereof a lowest cut-off frequency). The second resistor 423 adjusts the resistance of the first resistor 421 to a value, which is adapted to the total capacitance of the first and the second capacitors 422; 424.

Figure 6:
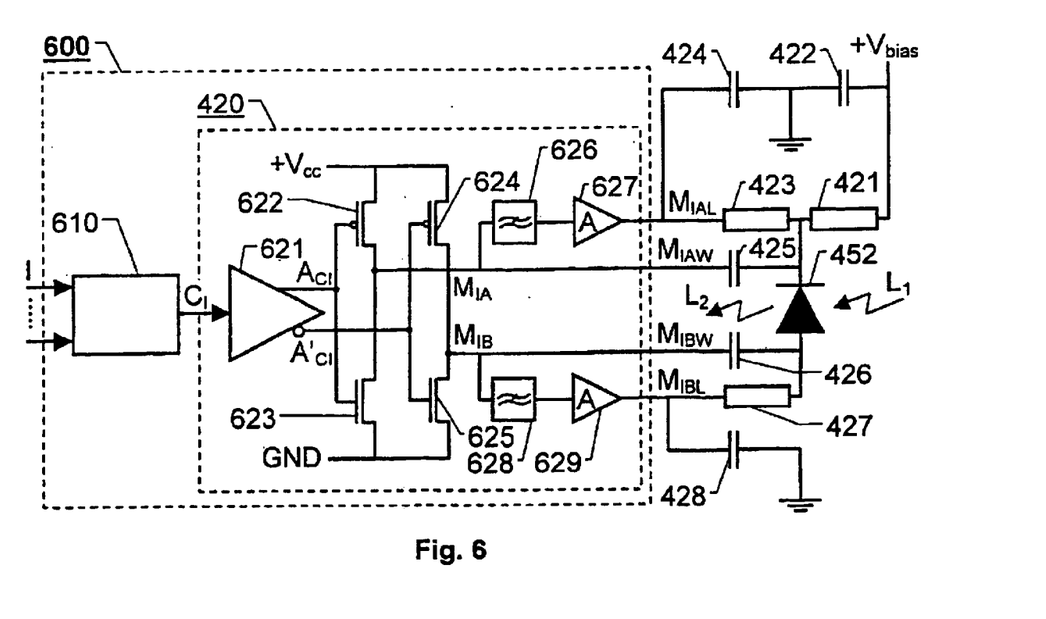
FIG. 6 shows a block diagram over a modulator driver in CMOS-technology according to an embodiment of, the invention, which may be included in the proposed optical transmitter shown in FIG. 5b.

FIG. 6 shows a block diagram over a modulator driver 420, in CMOS-technology, according to an embodiment of the invention, e.g. as described with reference to FIG. 5b above. Here, on one hand, a set of so-called 50w-drivers 622–625 deliver wide-frequency modulating signals $M_{IAW}$; $M_{IBW}$ containing spectral components that represent a relatively wide frequency range, and on the other hand, a set of so-called low-impedance drivers 626–629 deliver low-frequency modulating signals $M_{IAL}$; $M_{IBL}$, predominantly containing spectral components that represent relatively low frequencies. As mentioned earlier, the capacitors 425 and 426 may namely render the lower cut-off frequency for the transmission path to the modulator section 452 too high. According to this embodiment however, the low-frequency modulating signals $M_{IAL}$; $M_{IBL}$, (below this cut-off frequency) may thus nevertheless reach the modulator section 452.

The 50 Ω-drivers 622–625 include a first P-channel transistor 622 and a first N-channel transistor 623 connected between a supply voltage $+V_{cc}$ and the ground potential GND, which receive a non-inverted amplified control signal $A_{CI}$ from an amplifier 621 and generate on basis thereof a first differential modulating signal $M_{IA}$. The amplifier 621, in turn, bases its output signals $A_{CI}$ and $A'_{CI}$ on a control signal $C_I$. A second P-channel transistor 624 and a second N-channel transistor 625 connected between the supply voltage $+V_{cc}$ and the ground potential GND, receive an inverted amplified control signal $A'_{CI}$ from the amplifier 621 and generate on basis thereof a second differential modulating signal $M_{IB}$. The first differential modulating signal $M_{IA}$ and the second differential modulating signal $M_{IB}$ are fed out directly as the wide-frequency modulating signals $M_{IAW}$; $M_{IBW}$ to the modulator section 452 in a laser unit, via a respective decoupling capacitor 425 and 426.

A first low pass filtering chain containing a first lowpass filter 626 and a following first filter amplifier 627 receives the first differential modulating signal $M_{IA}$ and generates in response thereto a first low-frequency modulating signal $M_{IAL}$. Correspondingly, a second low pass filtering chain containing a second lowpass filter 628 and a following second filter amplifier; 629 receives the second differential modulating signal $M_{IB}$ and generates in response thereto a second low-frequency modulating signal $M_{IBL}$. The first and second lowpass filters 626 and 628 have a cut-off frequency, which corresponds to the cut-off frequency for the signal path via the first coupling capacitor 425 and the first resistor 426 respective the second coupling capacitor 426 and the second resistor 421.

Thus, the modulator driver 420 delivers modulating signals over a relatively broad frequency range to the modulator section !452, namely in the form of the low-frequency modulating signals $M_{IAL}$ and $M_{IBL}$ and the wide-frequency modulating signals $M_{IAW}$ and $M_{IBW}$. This arrangement is advantageous, since the spectral separation of the modulating signals $M_{IAL}$ and $M_{IBL}$; $M_{IAW}$; and $M_{IBW}$ means that the high-frequency signals can use a well terminated driver with small capacitors 425 and 426, while the terminated outputs need only be used for delivering the low-frequency signals $M_{IAL}$ and $M_{IBL}$.

In analogy with the biasing in the FIGS. 5a and 5b, a bias voltage $+V_{bias}$ allocates a suitable cathode voltage to the modulator section 452. The modulator section 452 receives a first low-frequency differential modulating signal $M_{IA}$ via a first coupling capacitor 425 and a second low-frequency differential modulating signal $M_{IB}$ via a second coupling capacitor 426. A first resistor 421 and a first capacitor 422 terminates the first differential modulating signal $M_{IA}$. The bias voltage $+V_{bias}$ is applied to a point between the first resistor 421 and the first capacitor 422. A second resistor 427 terminates the second differential modulating signal $M_{IB}$ directly to ground.

According to a preferred embodiment of the invention, the modulator driver 420 is included in an application specific integrated circuit (ASIC) 600. It is further preferable if this ASIC 600 also includes a protocol converter 410, which receives at least one signal I representing the information to be transmitted. The protocol converter 410 then produces the control signal C, based on the signal I as described above with reference to FIGS. 4 and 5a. Naturally, it is advantageous if the integrated protocol converter 410 additionally includes a duty cycle control unit for compensation with respect to the exponential transfer function of the modulator section 452.

Figure 7A:
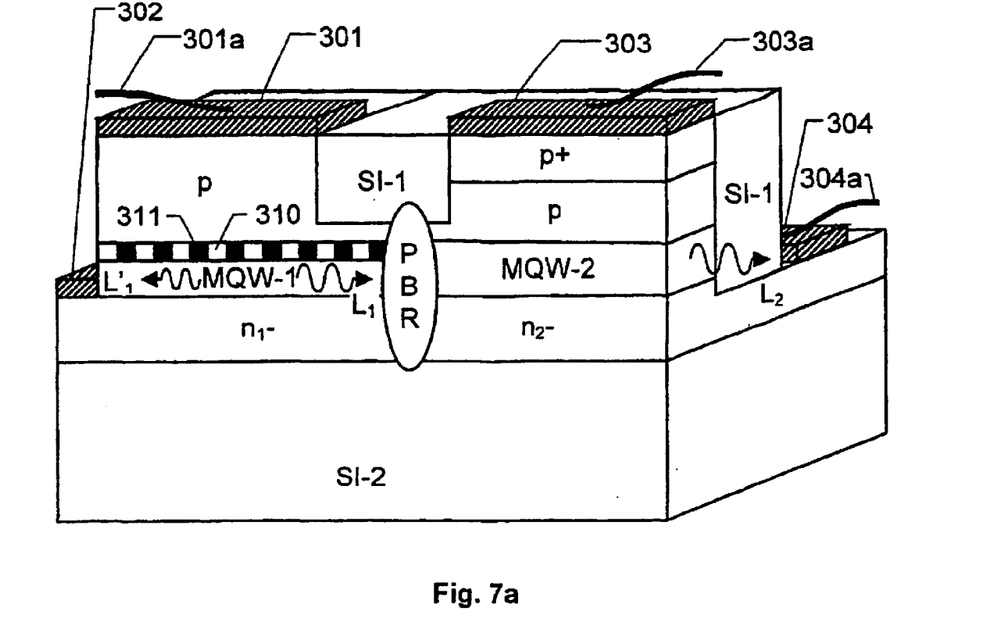
FIG. 7a shows an integrated laser-modulator structure according to a first alternative of a second embodiment of the invention.

FIG. 7a shows an integrated laser-modulator structure according to a first alternative of a second embodiment of the invention. The laser section here contains a separate anode area of a positive doping polarity p (e.g. InP), which is accessible via a first anode contact 301 and a first anode lead 301a. Correspondingly, the modulator section contains another separate anode area p+ (e.g. InGaAs), also of positive doping polarity, which is accessible via a second anode contact 303 and a second anode lead 303a. A semi-insulating region (i.e. un-doped area) SI-1 (e.g. InP) separates the laser anode area p from the modulator anode area p+. A sub-layer p of the anode area p+ in the modulator section extends below the first un-doped area SI-1 and contacts the laser anode area p. The laser section has a single-layered cathode area containing a first layer $n_1$– (e.g. InP) of negative doping polarity, which is placed on a semi-insulating un-doped substrate SI-2. The modulator section has a corresponding cathode area on top of the substrate SI-2 in the form of a second layer $n_2$– (e.g. InP) of negative doping polarity, which however, is electrically isolated the first layer $n_1$– by means of a proton bombarded region PBR.

The proton bombarded region PBR also separates a first quantum well structure MQW-1 from a second quantum well structure MQW-2 overlying the first layer $n_1$– respective the second layer $n_2$–. The proton bombarded region PBR thereby guarantees a complete electrical separation between the laser cathode area no- and the modulator cathode area $n_2$–.

The laser cathode area $n_1$– is externally accessible via a first cathode contact 302, while the modulator cathode area $n_2$– is externally accessible via a second cathode contact 304 and a second cathode lead 304a. For reasons of illustration, FIG. 7a shows the first cathode contact 302 to the immediately left of the first quantum well structure MQW-1. However, according to a preferred embodiment of the invention this contact 302 is instead positioned behind the first quantum well structure MQW-1 in level with the second cathode contact 304, such that the integrated modulator-laser structure obtains a planar vertical end-surface on the modulator side. It is worth mentioning that this laser-modulator structure does not require any biasing, since no diodes are used to separate the cathode areas electrically from each other. Hence, the structure also lacks a bias contact.

In analogy with the laser-modulator structure according to the first embodiment of the invention, the structure according to this embodiment also generates a primary light signal $L_1$ in the first quantum well structure MQW-1 below the laser anode area $p_1$. The second quantum well structure MQW-2 below the modulator anode area p+; $p_1$, influences the primary light signal $L_1$ by means of electroabsorption (i.e. attenuating the primary light signal $L_1$) such that a resulting modulated light signal $L_2$ is produced depending on the voltage across the second anode contact 303 and the second cathode contact 304. A relatively high voltage over the contacts thereby results in a modulated light signal $L_2$ of comparatively low power and a relatively low voltage results in a modulated light signal $L_2$ of comparatively high power.

The first quantum well structure MQW-1 includes a layer, which includes different impurities 310 of e.g. InP and 311 of e.g. InGaAsP that are distributed over the structure MQW-1 in an alternating manner. The different materials in the impurities 310 and 311 have different refractive indices and thus represent a grating, which determines the wavelength of the light signal $L_1$ being produced by the laser. Preferably, the impurities 310 and 311 have a positive doping polarity.

Figure 7B:
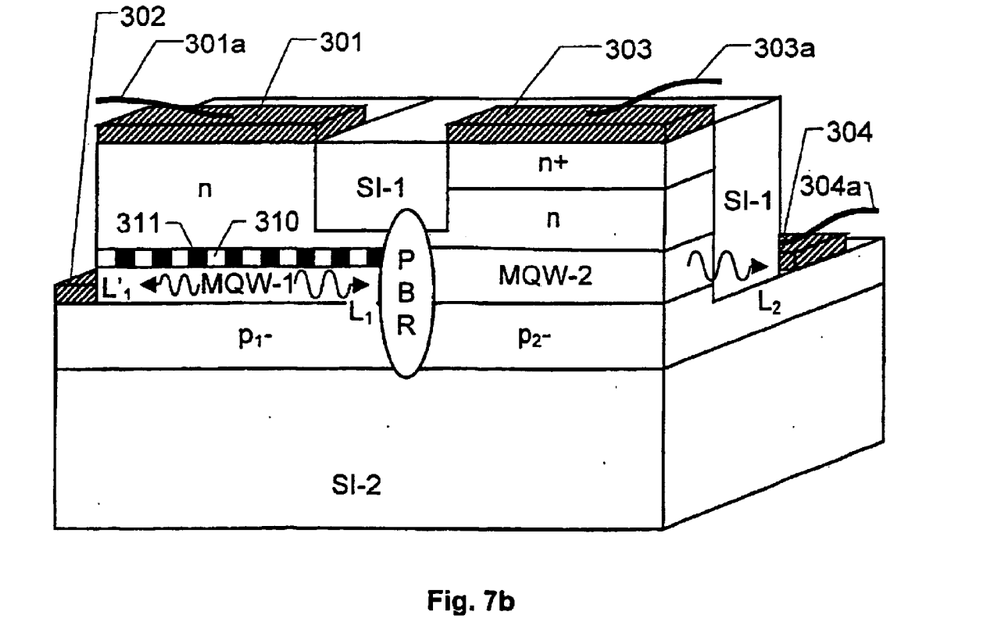
FIG. 7b shows an integrated laser-modulator structure according to a second alternative of the second embodiment of the invention.

FIG. 7b shows an integrated laser-modulator structure according to a second alternative of the second embodiment of the invention, which is essentially the same as that illustrated in FIG. 7a. However, in analogy with the alteration of polarities between the embodiments described in FIGS. 3a and 3b, all layers $p_1$–, $P_2$–, n; n+ and contacts 301–304 have the opposite polarity relative the embodiment shown in FIG. 7a. Likewise, the modulator has a common anode (as opposed to common cathode) and the drive voltage to the laser must be negative (instead of positive). Also here, the figure shows the first cathode contact 302 to the immediately left of the first quantum well structure MQW-1, for reasons of illustration. In the actual design, however, this contact 302 is instead preferably positioned behind the first quantum well structure MQW-1 in level with the second cathode contact 304, such that the integrated modulator-laser structure obtains a planar vertical end-surface on the modulator side.

The optical transmitters described above with reference to the FIGS. 4, 5a and 5b are primarily adapted to the laser-modulator structures shown in the FIGS. 3a, 3c and 7a respectively. Nevertheless, the teachings of this specification as a whole is deemed to provide sufficient guidance for the skilled person to design corresponding optical transmitters also for the reverse-polarity laser-modulator structures shown in the FIGS. 3b and 7b.

The term "comprises/comprising" when used in this specification is taken to specify the presence of stated features, integers, steps or components. However, the term does not preclude the presence or addition of one or more additional features, integers, steps or components or groups thereof.

The invention is not restricted to the described embodiments in the figures, but may be varied freely within the scope of the claims.

What is claimed is:

1. An integrated device for emitting a modulated light signal, comprising a laser section and a modulator section, the laser section generating a primary light signal by means of a distributed feedback process in a first quantum well structure, the modulator section influencing the primary light signal by means of an electroabsorption process in a second quantum well structure to produce the modulated light signal, wherein the laser section and the modulator section are electrically separated from each other such that a laser anode area is electrically isolated from a corresponding modulator anode area and a laser cathode area is electrically isolated from a corresponding modulator cathode area.

2. An integrated device according to claim 1, wherein the laser section comprises at least one externally accessible laser anode contact and at least one externally accessible laser cathode contact, and the modulator section comprises at least one externally accessible modulator anode contact and at least one externally accessible modulator cathode contact.

3. An integrated device according to claim 1, wherein the device comprises a semi-insulating region between the laser anode area and the modulator anode area which electrically separates these areas from each other.

4. An integrated device according to claim 1, wherein the device comprises a proton bombarded region between the first quantum well structure and the second quantum well structure, the proton bombarded region extending through respective doped layers of a first doping polarity below the quantum well structures such that also the doped layers are electrically separated from each other into a first doped layer and a second doped layer.

5. An integrated device according to claim 4, wherein the device comprises two mutually reverse biased diodes, the diodes separating the laser cathode area electrically from the modulator cathode area.

6. An integrated device according to claim 5, wherein the diodes are represented by a separation layer below the second doped layer, the separation layer having a doping polarity which is opposite to the second doping polarity.

7. An integrated device according to claim 5, wherein the separation layer forms a diode bias area between the anodes of the diodes, the diode bias area being externally accessible via a bias contact.

8. An integrated device according to claim 4, wherein the device comprises a semi-insulating layer below the first doped layer, the semi-insulating layer separating the laser cathode area electrically from the modulator cathode area.

9. An integrated device according claim 1, wherein the primary light signal represents a substantially continuous light, whereas the intensity of the modulated light signal varies over time.

10. An optical transmitter for producing a modulated light signal that carries information, comprising a modulator driver receiving a control signal and in response thereto delivering a modulating signal, a controllable distributed feedback laser unit
receiving a bias current and in response thereto generating a primary light signal, and
receiving the modulating signal and in response thereto influencing the primary light signal such that the modulated light signal is generated, and a laser bias control unit generating the bias current to the laser unit for controlling the output power level of the primary light signal, wherein the laser unit comprises an integrated device comprising:
a laser section and a modulator section, the laser section generating a primary light signal by means of a distributed feedback process in a first quantum well structure, the modulator section influencing the primary light signal by means of an electroabsorption process in a second quantum well structure to produce the modulated light signal, wherein the laser section and the modulator section are electrically separated from each other such that a laser anode area is electrically isolated from a corresponding modulator anode area and a laser cathode area is electrically isolated from a corresponding modulator cathode area.

11. An optical transmitter according to claim 10, wherein the transmitter comprises a protocol converter receiving at least one signal that represents the information f and in response thereto generating the control signal.

12. An optical transmitter according to claim 10, wherein the transmitter comprises a monitor diode detecting a leak signal of the primary light signal and on basis thereof delivering a feedback signal to the laser bias control unit, the feedback signal forming a basis for the bias current.

13. An optical transmitter according to claim 12, wherein the modulating signal comprises:

a varying modulator voltage component which represents the information, and a substantially fixed modulator bias voltage component.

14. An optical transmitter according to claim 10, wherein the modulator driver comprises a terminated output delivering the modulating signal to the laser unit according to a single-ended format.

15. An optical transmitter according to claim 10, wherein the modulator driver comprises an output which is differentially coupled to the laser unit, the output delivering the modulating signal to the laser unit according to a differential format.

16. An optical transmitter according to claim 15, wherein the modulator driver comprises a separate bias input for receiving a reference voltage level which provides a drive voltage to a modulator section in the laser unit.

17. An optical transmitter according to claim 13, wherein the transmitter comprises a duty cycle control unit to compensate for an exponential transfer function of a modulator section in the laser unit.

18. An optical transmitter according to claim 17, wherein the duty cycle control unit is included in an application specific integrated circuit.

19. An optical transmitter according to claim 18, wherein the application specific integrated circuit additionally comprises at least one of the protocol converter and the modulator driver.

20. An optical transmitter according to claim 15, wherein the modulator driver comprises at least one terminated output which delivers a respective low-frequency modulating signal to the laser unit which predominantly contains spectral components that represent relatively low frequencies, whereas the differential outputs deliver wide-frequency modulating signals which contains spectral components that represent both relatively high frequencies and relatively low frequencies.

21. An optical transmitter according to claim 20, wherein the modulator driver comprises at least one low pass filtering chain receiving a respective primary modulating signal and in response thereto generating the respective low-frequency modulating signals.

* * * * *

UNITED STATES PATENT AND TRADEMARK OFFICE
CERTIFICATE OF CORRECTION

PATENT NO. : 6,859,479 B2
DATED : February 22, 2005
INVENTOR(S) : Svenson It is certified that error appears in the above-identified patent and that said Letters Patent is hereby corrected as shown below:

Title page,
Item [56], References Cited, FOREIGN PATENT DOCUMENTS, insert the following:
-- JP   9139551  A   5/1997 --.

Signed and Sealed this

Twenty-fourth Day of May, 2005

JON W. DUDAS
*Director of the United States Patent and Trademark Office*